US008652874B2

(12) United States Patent
Wang et al.

(10) Patent No.: US 8,652,874 B2
(45) Date of Patent: Feb. 18, 2014

(54) LARGE SCALE PATTERNED GROWTH OF ALIGNED ONE-DIMENSIONAL NANOSTRUCTURES

(75) Inventors: Zhong L. Wang, Marietta, GA (US); Christopher J. Summers, Dunwoody, GA (US); Xudong Wang, Atlanta, GA (US); Elton D Graugnard, Atlanta, GA (US); Jeffrey King, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/300,025

(22) Filed: Nov. 18, 2011

(65) Prior Publication Data

US 2012/0061348 A1 Mar. 15, 2012

Related U.S. Application Data

(62) Division of application No. 12/028,218, filed on Feb. 8, 2008, now Pat. No. 8,076,701, which is a division of application No. 11/010,178, filed on Dec. 10, 2004, now Pat. No. 7,351,607.

(60) Provisional application No. 60/528,740, filed on Dec. 11, 2003.

(51) Int. Cl.
*H01L 29/06* (2006.01)

(52) U.S. Cl.
USPC ............... 438/99; 438/104; 438/942; 257/40; 257/43; 257/E51.001; 257/E51.04; 977/712; 977/742; 977/811; 977/842; 977/843; 977/883

(58) Field of Classification Search
USPC ........ 438/99, 104, 942; 257/40, 43, E51.001, 257/E51.04; 977/712, 742, 811, 842, 843, 977/883, 890, 891
See application file for complete search history.

(56) References Cited

U.S. PATENT DOCUMENTS

| | | | | |
|---|---|---|---|---|
| 7,018,944 | B1 * | 3/2006 | Carnahan | 438/736 |
| 2004/0252737 | A1 * | 12/2004 | Yi et al. | 372/43 |
| 2005/0112048 | A1 * | 5/2005 | Tsakalakos et al. | 423/439 |
| 2008/0128681 | A1 * | 6/2008 | Meng et al. | 257/40 |

OTHER PUBLICATIONS

Huang, M. et al. "Room-Temperature Ultraviolet Nanowire Nanolasers." Science, vol. 292, pp. 1897-1899. Jun. 8, 2001.*

* cited by examiner

*Primary Examiner* — Tom Thomas
*Assistant Examiner* — Christopher M Roland
(74) *Attorney, Agent, or Firm* — Bockhop & Associates, LLC; Bryan W. Bockhop

(57) ABSTRACT

A method of making nanostructures using a self-assembled monolayer of organic spheres is disclosed. The nanostructures include bowl-shaped structures and patterned elongated nanostructures. A bowl-shaped nanostructure with a nanorod grown from a conductive substrate through the bowl-shaped nanostructure may be configured as a field emitter or a vertical field effect transistor. A method of separating nanoparticles of a desired size employs an array of bowl-shaped structures.

8 Claims, 7 Drawing Sheets

LARGE SCALE PATTERNED GROWTH OF ALIGNED ONE-DIMENSIONAL NANOSTRUCTURES

CROSS-REFERENCE TO A RELATED NON-PROVISIONAL PATENT APPLICATION

The present application claims priority on U.S. Provisional patent application Ser. No. 12/028,218, filed Feb. 8, 2008 and on Ser. No. 11/010,178, filed Dec. 10, 2004, the entirety of both of which is incorporated herein by reference.

CROSS-REFERENCE TO A RELATED PROVISIONAL PATENT APPLICATION

The present application claims priority on U.S. Provisional Patent Application Ser. No. 60/528,740, filed Dec. 11, 2003, the entirety of which is incorporated herein by reference.

STATEMENT REGARDING GOVERNMENT RIGHTS

This invention was made with Government support under Contract No. DMR-9733160, awarded by the National Science Foundation, and Contract No. ARO DAAD 19-01-0603, awarded by the U.S. Army, the United States Government therefore has certain rights in the invention.

BACKGROUND OF THE INVENTION

1. Field of the Invention

The present invention relates to nanostructures and, more specifically to patterned nanostructures.

2. Description of the Prior Art

Binary semiconducting oxides often have distinctive properties and can be used as transparent conducting oxide (TCO) materials and gas sensors. Current studies of semiconducting oxides have been focused on two-dimensional films and zero-dimensional nanoparticles. For example, fluorine-doped tin oxide films are used in architectural glass applications because of their low emissivity for thermal infrared heat. Tin-doped indium oxide (ITO) films can be used for flat panel displays (FPDs) due to their high electrical conductivity and high optical transparency; and zinc oxide can be used as an alternative material for ITO because of its lower cost and easier etchability. Tin oxide nanoparticles can be used as sensor materials for detecting leakage of several inflammable gases owing to their high sensitivity to low gas concentrations.

In contrast, investigations of wire-like semiconducting oxide nano structures can be difficult due to the unavailability of nanowire structures. Wire-like nano structures have attracted extensive interest over the past decade due to their great potential for addressing some basic issues about dimensionality and space confined transport phenomena as well as related applications. In geometrical structures, these nanostructures can be classified into two main groups: hollow nanotubes and solid nanowires, which have a common characteristic of cylindrical symmetric cross-sections. Besides nanotubes, many other wire-like nanomaterials, such as carbides, nitrides, compound semiconductors, element semiconductors, and oxide nanowires have been successfully fabricated.

However, the nanostructures discussed above can have a variety of deficiencies. For example, often it is difficult to control the structure and morphology of many nanostructures. Further, many nanostructures are not defect and/or dislocation free. These deficiencies can cause problems such as, for example, uncontrolled properties due to uncontrolled structure and morphology, scattering from dislocations in electric transport applications, and degraded optical properties.

Semiconducting oxides, as an important series of materials candidates for optoelectronic devices and sensors, have attracted considerable attention in scientific research and technological applications. Recently, quasi-one-dimensional nanostructures for the functional materials have been successfully fabricated by using various approaches including thermal evaporation, sol-gel, arc discharge, laser ablation and template-based method. To date, extensive research work has been focused on ZnO, which is one of the most useful oxides for optical and sensor applications. Many different morphological ZnO nanostructures, including wires, belts, and rods, etc., have been fabricated.

In ZnO, a combination of the three types of fast growth directions ($[2\bar{1}\bar{1}0]$, $[01\bar{1}0]$, and [0001]) and the three area-adjustable facets $[2\bar{1}\bar{1}0]$, $[01\bar{1}0]$, and [0001]) of ZnO has resulted in a diverse group of hierarchical and intricate nanostructures. In addition to non-central symmetry, the semiconducting and piezoelectric as well as surface polarization characteristics of ZnO make it one of the most exciting oxide nanostructures for investigating nano-scale physical and chemical properties. Structural configurations such as piezoelectric nanobelts, nanosprings, and nanorings, etc., are known.

Certain patterned nanostructures have utility in many different applications, including electronics, optics and size differentiation of various particles. Unfortunately, such patterned nanostructures may be difficult to make at a large scale.

Therefore, there is a need for a method of making patterned nanostructures at a large scale.

There is also a need for patterned nanostructures.

SUMMARY OF THE INVENTION

The disadvantages of the prior art are overcome by the present invention which, in one aspect, is a nanostructure that includes a substrate having a top surface and a metal oxide bowl-shaped structure. The bowl-shaped structure has a bottom end and a maximum diameter in a range of 50 nanometers to 4,000 nanometers. The bowl-shaped structure is disposed on the top surface of the substrate with the bottom end adjacent thereto. The bowl-shaped structure defines a hemispherical void that opens away from the top surface of the substrate.

In another aspect, the invention is a method of making a bowl-shaped structure, in which an organic sphere is placed onto a top surface of a substrate and a metal oxide is applied to the organic sphere, thereby forming a metal oxide shell. A portion of the metal oxide shell and a corresponding portion of the sphere are removed and any remaining portion of the organic sphere is removed, thereby leaving a bowl-shaped structure.

In another aspect, the invention is an array of patterned nanostructures that include a substrate having a top surface and a plurality of metal oxide nanorods extending upwardly from the top surface. The nanorods are disposed in an patterned arrangement.

In another aspect, the invention is a method of making patterned nanostructures, in which a self-assembled monolayer of organic spheres is placed on a substrate. The organic spheres defining interstitial areas between the organic spheres. Catalyst particles are applied and allowed to settle onto the substrate in the interstitial areas. The organic spheres are removed, thereby leaving a patterned arrangement of catalyst particles on the substrate. Nanorods are grown from the substrate in the interstitial areas.

In another aspect, the invention is a field emitter that includes a conductive substrate, an insulating layer, a bowl-shaped structure, and a nanorod. The insulating layer is disposed on the conductive substrate and defines a first hole therethrough. The bowl-shaped structure extends upwardly from the insulating layer and defines a second hole in substantial alignment with the first hole. The bowl-shaped structure defines a concave void. The nanorod extends upwardly from the conductive substrate through the first hole and the second hole into the concave void. When a predetermined potential is applied between the bowl-shaped structure and the rod, electrons are emitted from the rod.

In another aspect, the invention is a method of making a field emitter, in which a catalyst mantle is applied to a substrate, an insulating layer is applied to the catalyst mantle, and an organic sphere is placed onto the insulating mantle. A metal oxide is applied to the organic sphere, thereby forming a metal oxide shell. The metal oxide shell defines an opening to the insulating layer at an area where the organic sphere was in contact with the insulating layer. A portion of the metal oxide shell and a corresponding portion of the sphere are removed. Any remaining portion of the organic sphere is removed, thereby leaving a bowl-shaped structure. A hole is etched into the insulating layer through the opening defined by the metal oxide shell. The hole extends to the catalyst mantle. Heat sufficient to melt a portion of the catalyst mantle is applied so as to form a catalyst particle in alignment with the hole etched in the insulating layer. An elongated nanostructure is grown from the catalyst particle from the substrate through the hole etched in the insulating layer into the bowl-shaped structure.

In another aspect, the invention is a field effect transistor circuit that includes a first nano-bowl structure and a second nano-bowl structure in vertical alignment with the first-nanobowl structure. The first nano-bowl structure includes a conductive substrate, an insulating layer disposed on the conductive substrate, a nano-bowl disposed on the insulating layer and an elongated nanostructure extending from the conductive substrate through the insulating layer into the nano-bowl and electrically isolated from the nano-bowl. Similarly, the second nano-bowl structure includes a conductive substrate, an insulating layer disposed on the conductive substrate, a nano-bowl disposed on the insulating layer and an elongated nanostructure extending from the conductive substrate through the insulating layer into the nano-bowl and electrically isolated from the nano-bow. When a first electrical potential is applied to the substrate of the first nano-bowl structure; a second electrical potential, different from the first electrical potential, is applied to the nano-bowl of the first nano-bowl structure; and a third electrical potential, different from the first electrical potential, is applied to the substrate of the second nano-bowl structure, then the substrate of the first nano-bowl structure acts as a source, the nano-bowl of the first nano-bowl structure acts as a gate, and the substrate of the second nano-bowl structure acts as a drain.

In another aspect, the invention is a method of size-sorting nano-particles, in which the nano-particles are placed onto an array of bowl-shaped structures. Each bowl-shaped structure has a maximum diameter corresponding to a predetermined desired diameter of nano-particle. A force is applied to the nano-particles that is sufficient to remove all of the nano-particles, except for any nano-particles that have settled into bowl-shaped structures in the array of bowl-shaped structures.

In yet another aspect, the invention is a method of making a photonic crystal, in which a patterned array of nanorods is grown on a substrate. A sufficient number of layers of a metal oxide is applied to the nanorods so that a contiguous structure is formed around the nanorods. The contiguous structure defines an array of holes passing therethrough. The holes are spaced apart at a distance that achieves a desired optical property.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
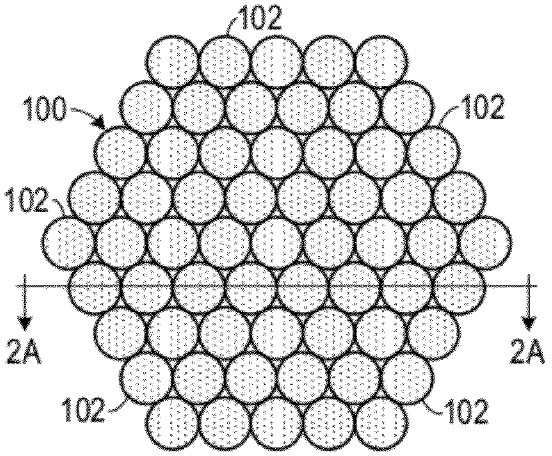
FIG. 1 is a top view of a self-assembled monolayer of polystyrene spheres.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2A:
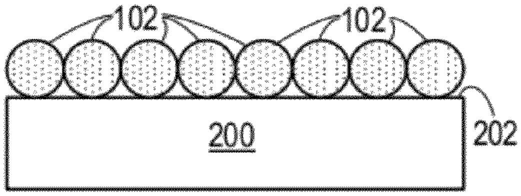
FIGS. 2A-2D is a series of cross-sectional drawings showing a method in which the monolayer of polystyrene spheres shown in FIG. 1 is used in making nano-bowl structures.

In one embodiment of the invention, a monolayer of organic spheres, such as polystyrene spheres, is self-assembled onto a substrate. As shown in FIG. 1, such a monolayer 100 includes a plurality of spheres 102 arranged in an close packing arrangement, such as a hexagonal arrangement. As shown in FIG. 2A, the spheres 102 form a monolayer on the top surface 202 of a substrate 200 (which could include a single crystal of aluminum oxide).

Figure 9A:
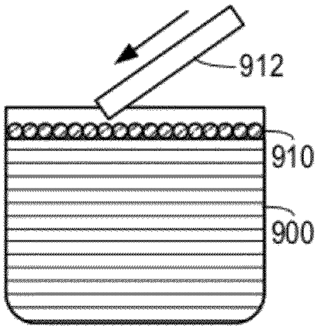
FIGS. 9A-9E is a series of cross-sectional drawings showing a method for forming a self-assembled monolayer of organic spheres.
Figure 9B:
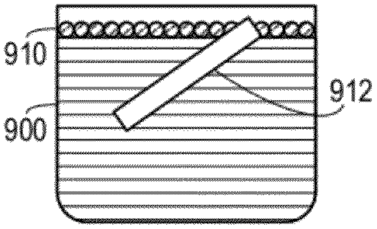
Figure 9E:
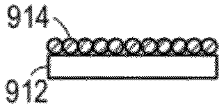
Figure 9C:
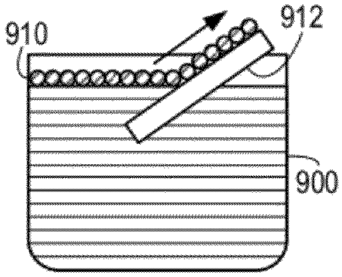
Figure 9D:
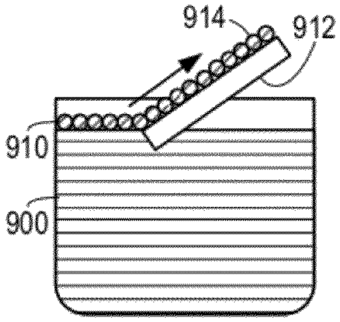

As shown in FIGS. 9A-9E, one way of creating the monolayer 914 on the substrate 912 starts with adding a plurality of organic spheres 910 to a liquid 900, such as water, having a surface tension (as a result of adding a surfactant) that would cause the organic spheres 910 to self-assemble into a substantially ordered monolayer. As shown in FIG. 9B, the substrate 912 is placed in the liquid and then gradually drawn out in a direction that is transverse to the top surface of the liquid so that the organic spheres become disposed on the top surface of the substrate 912 to form a monolayer 914. Any remaining liquid is then allowed to dry from the substrate and the organic spheres.

Figure 2B:
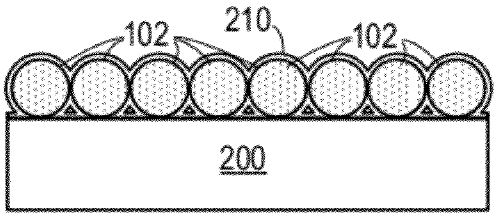

Returning to FIG. 2B, a metal oxide, such as titania, is applied to the spheres 102 to form a metal oxide shell 210 around the spheres 102. This is typically done through an atomic layer deposition process.

In the atomic layer deposition process, the organic spheres 102 and the substrate 200 are placed in a chamber, which is maintained at a predetermined temperature and a predetermined pressure. Alternating pulses of a gas phase metal (such as titanium chloride gas) and water vapor are introduced into the chamber until the desired thickness of metal oxide has been applied to the organic spheres 102. The chamber is purged between each pulse with a non-reactive gas, such as nitrogen.

Figure 2C:
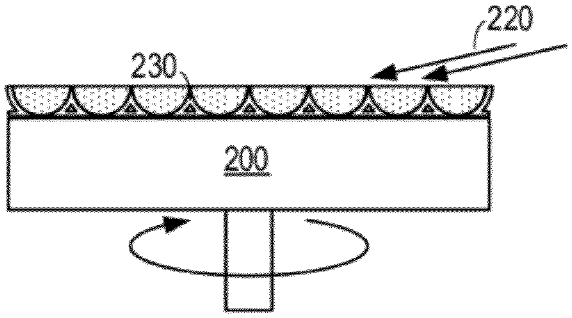
Figure 2D:
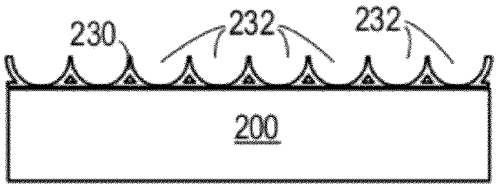

As shown in FIG. 2C, approximately the top half of the metal oxide shell 210 and the spheres 102 is removed by an ion milling process. Ion milling occurs by rotating the substrate 220 and applying an ion beam 220 at an angle for a predetermined amount of time. As shown in FIG. 2D, the any remaining portion of the spheres is removed, for example with a solvent such as toluene, thereby leaving an array of bowl-shaped structures 230. The bowl-shaped structures 230 may then be annealed to cause the metal oxide to crystallize into an anatase.

Each metal oxide bowl-shaped structure 230 has a bottom end and a maximum diameter in a range of 50 nanometers to 4,000 nanometers and disposed on the top surface 202 of the substrate 200 with the bottom end adjacent to the top surface. Each bowl-shaped structure 230 defines a hemispherical void 232 that opens away from the top surface of the substrate.

Figure 3:
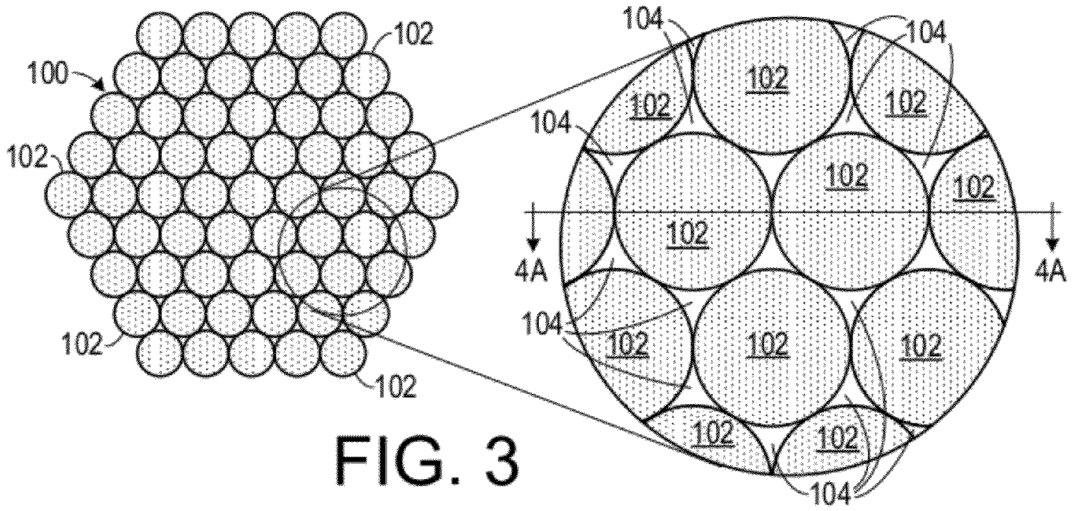
FIG. 3 is a is a top view of a self-assembled monolayer of polystyrene spheres and a detail thereof.
Figure 4A:
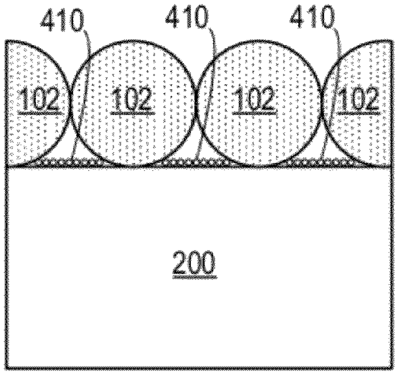
FIGS. 4A-4C is a series of cross-sectional drawings showing a method in which the monolayer of polystyrene spheres shown in FIG. 1 is used in making patterned elongated nanostructures.

In another embodiment, an array of patterned nanostructures may be made starting with a monolayer 100 of organic spheres 102, as shown in FIG. 3. As shown in the detail of FIG. 3, the organic spheres define interstitial areas 104 between the organic spheres 102. As shown in FIG. 4A, catalyst particles 410 (such as gold) are allowed to settle onto the substrate 200 in the interstitial areas 104. The catalyst particles can include gold. Other examples of catalysts include iron and nickel, depending on the application. One of skill in the art would recognize other suitable catalysts, depending on the specific embodiment.

Figure 4B:
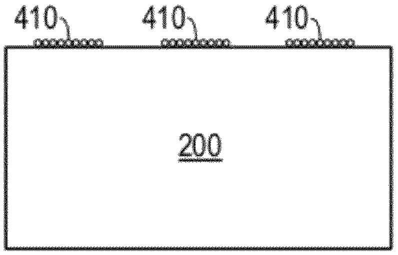
Figure 4C:
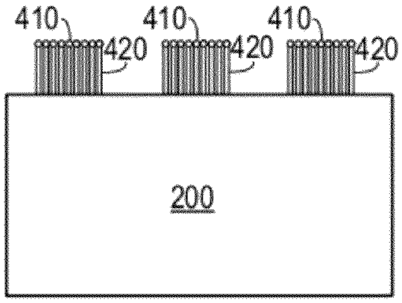
Figure 4D:
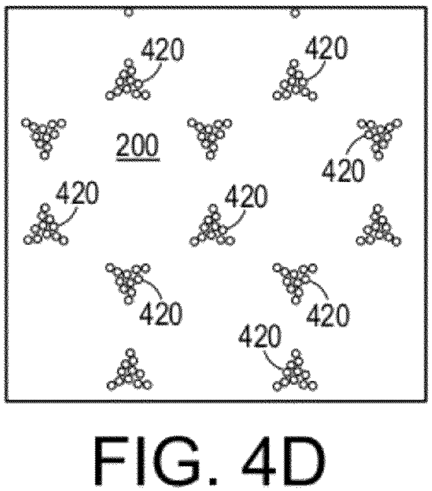
FIG. 4D is a top view of a plurality of patterned elongated nanostructures.

The organic spheres 102 are removed, such as with a solvent, and a patterned arrangement of catalyst particles 410 is left on the substrate, as shown in FIG. 4B. Metal oxide nanorods 420 (such as zinc oxide), or carbon nanotubes, are then grown to extend upwardly from the substrate 200 in clusters in the interstitial areas, as shown in FIG. 4C. This could be done with a chemical vapor deposition process. As shown in FIG. 4D, the nanorods 420 are arranged in a pattern corresponding to a projection of the interstitial areas 104 of shapes (such as the spheres 102) onto the substrate 200. One ordered arrangement of the nanorods 420 could correspond to a hexagonal close packing arrangement.

Figure 5A:
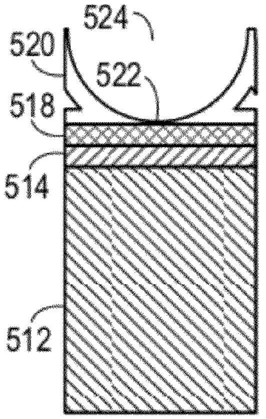
FIGS. 5A-5D is a series of cross-sectional drawings showing a method for making a field emitter.
Figure 5B:
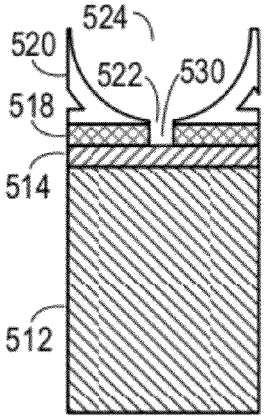
Figure 5C:
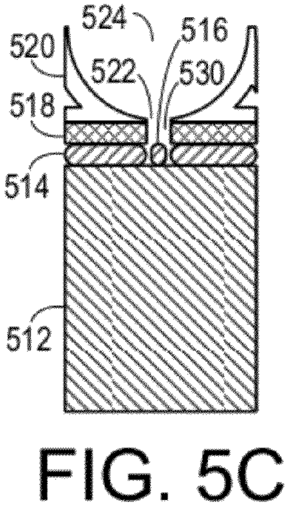
Figure 5D:
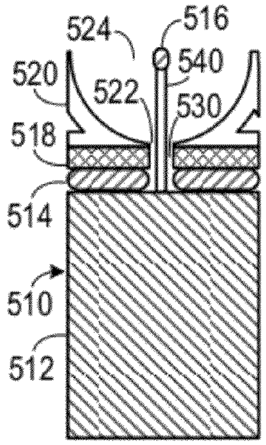

As shown in FIG. 5D, a field emitter 510, according to one embodiment of the invention, includes a conductive substrate 512 that includes a catalyst mantle 514. An insulating layer 518 is disposed on the conductive substrate 512 and defines a first hole 530 therethrough. A bowl-shaped structure 520 extends upwardly from the insulating layer 518 and defines a second hole 522 in substantial alignment with the first hole 530. The bowl-shaped structure 520 defines a concave void 524. A nanorod 540 extends upwardly from the conductive substrate 512 through the first hole 530 and the second hole 522 into the concave void 524. When a predetermined potential is applied between the bowl-shaped structure 520 and the rod 540, the rod will emit electrons. An anode (not shown) may be placed above the rod 540 to absorb the emitted electrons.

The field emitter 510 may be made, as shown in FIGS. 5A-5D, by applying the catalyst mantle 514 (such as a gold layer) to a substrate 512 and applying the insulating layer 518 to the catalyst mantle 514 and then making a nano-bowl structure as described above.

The second hole 522 is naturally formed as metal oxide is deposited in the contact area between the organic sphere and the insulating layer 518. The metal oxide acts as a mask when etching the first hole 530 into the insulating layer 518 to the catalyst mantle 514. Heat sufficient to melt a portion of the catalyst mantle 514 is applied so as to form a catalyst particle 516 in alignment with the hole 530 etched in the insulating layer. An elongated nanostructure 540 (such as a zinc oxide nanorod or a carbon nanotube) is grown the catalyst particle 516 in the method for growing patterned nanorods described above.

Figure 6:
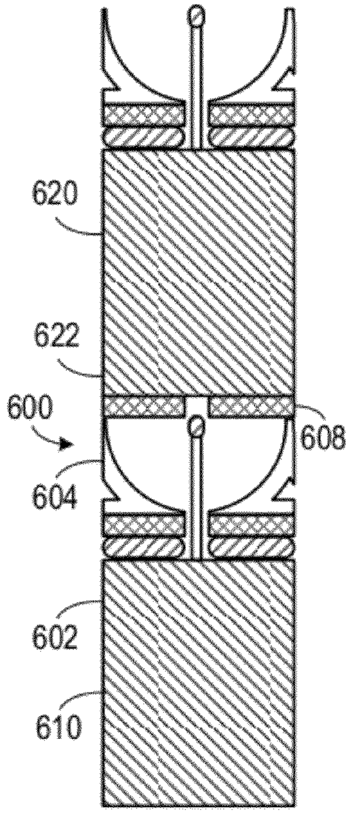
FIG. 6 is a cross-sectional view of a field effect transistor.
Figure 7A:
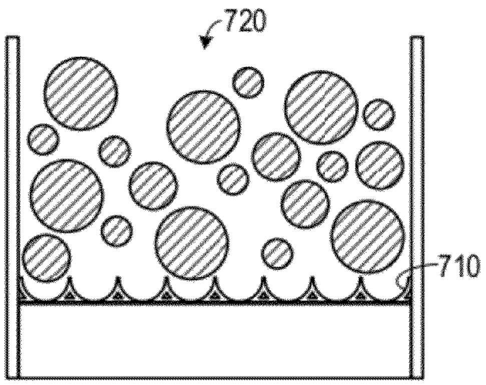
FIGS. 7A-7D is a series of cross-sectional drawings showing a method for separating nano-particles of a predetermined size.
Figure 7B:
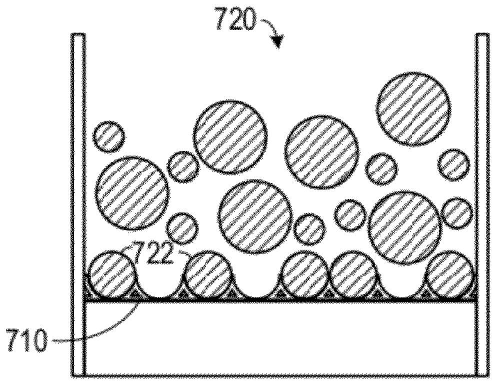
Figure 7C:
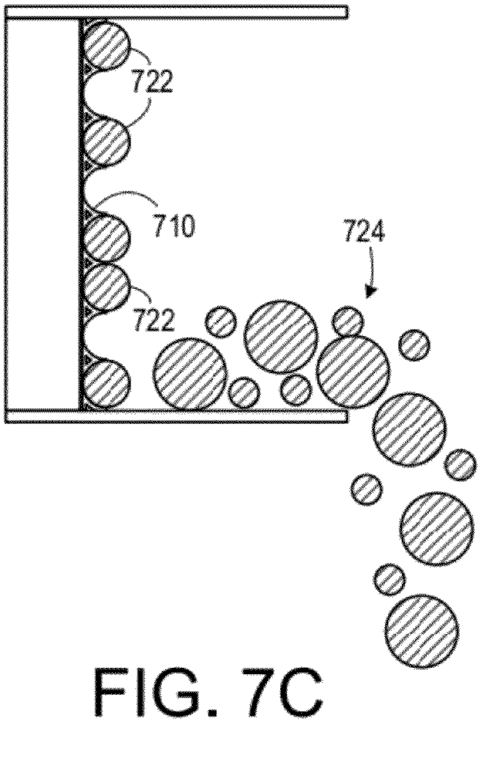
Figure 7D:
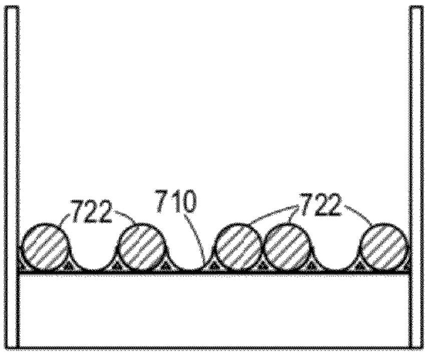
Figure 8A:
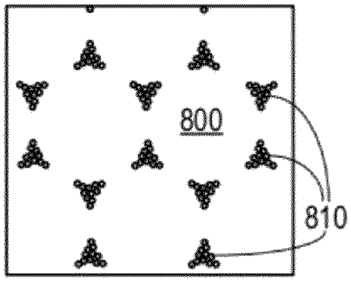
FIGS. 8A-8G is a series of top views showing a method for making a photonic crystal.
Figure 8B:
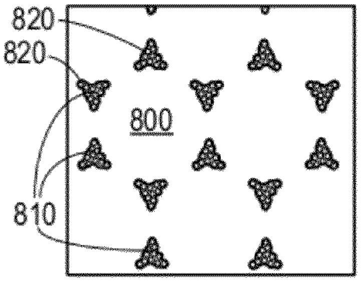
Figure 8C:
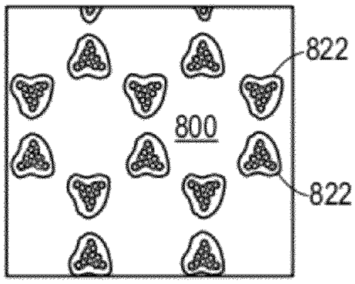
Figure 8D:
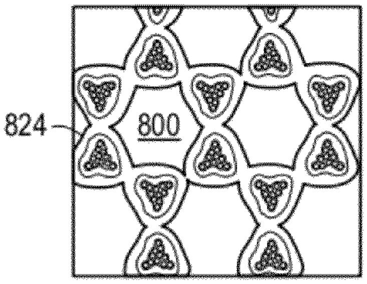
Figure 8E:
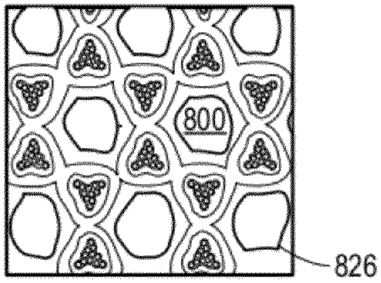
Figure 8F:
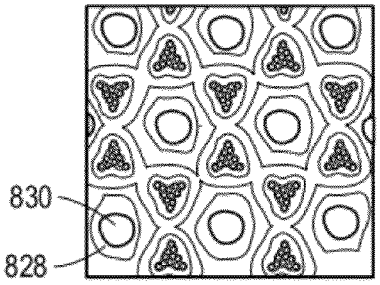
Figure 8G:
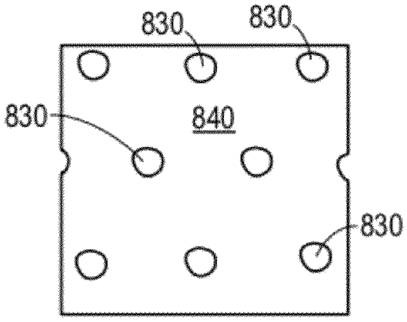

As shown in FIG. 6, a field effect transistor 600 circuit may be made by vertically aligning a first nano-bowl structure 610 and a second nano-bowl structure 620. When a first electrical potential is applied to the substrate 602 of the first nano-bowl structure 610; a second electrical potential, different from the first electrical potential, is applied to the nano-bowl 604 of the first nano-bowl structure 610; and a third electrical potential, different from the first electrical potential, is applied to the substrate 622 of the second nano-bowl structure 620, then the substrate 602 of the first nano-bowl structure 610 acts as a source, the nano-bowl 604 of the first nano-bowl structure 610 acts as a gate, and the substrate 622 of the second nano-bowl structure 620 acts as a drain. An insulating layer 608 should separate nano-bowl 604 from substrate 622. As would be apparent to those of skill in the electronic arts, this embodiment allows for the creation of complex three-dimensional transistor circuits.

A method of size-sorting nano-particles is shown in FIGS. 7A-7D. The nano-particles 720 are placed onto an array 710 of bowl-shaped structures. Each bowl-shaped structure has a maximum diameter corresponding to a predetermined desired diameter of nano-particle. A force is applied to the nano-particles 720 that is sufficient to remove all of the nano-particles of undesirable size 724, leaving any nano-particles 722 that have settled into bowl-shaped structures in the array of bowl-shaped structures.

A method of making a photonic crystal is shown in FIGS. 8A-8G. A patterned array of nanorods 810 is grown on a substrate 800, as disclosed above. Layers of a metal oxide 822, 824, 826 and 828 (such as titania) are repeatedly applied to the nanorods 810 untile a contiguous structure 840 is formed around the nanorods 810. The contiguous structure 840 defines an array of holes 830 passing therethrough. The holes 830 are paced apart at a distance that achieves a desired optical property.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

Figure 10:
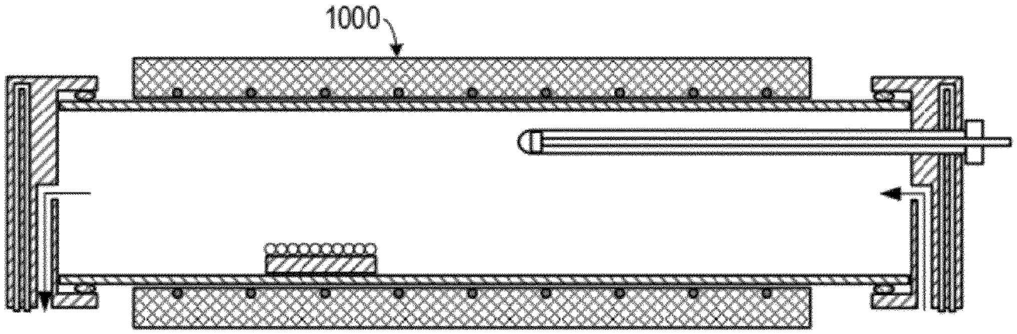
FIG. 10 is a cross-sectional view of a tube furnace.

A tube furnace 1000 of the type that may be used in the chemical vapor deposition process used herein is shown in FIG. 10.

Figure 11A:
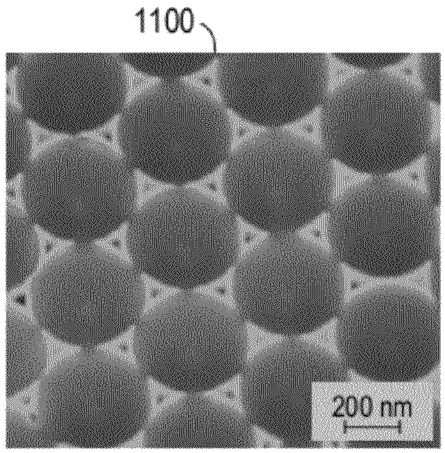
FIGS. 11A-11E is a plurality of micrographs of several embodiments of the invention.
Figure 11B:
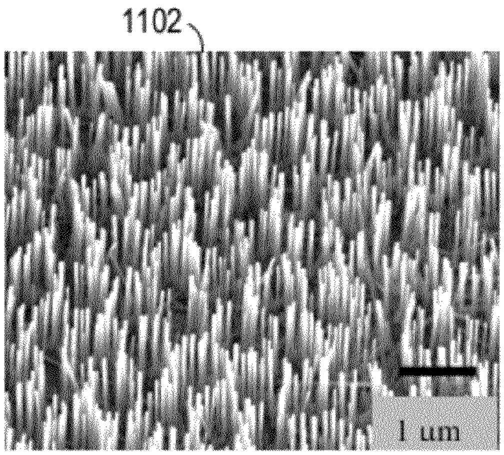
Figure 11C:
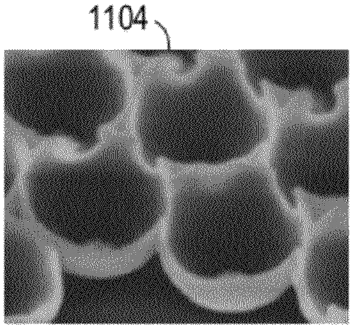
Figure 11D:
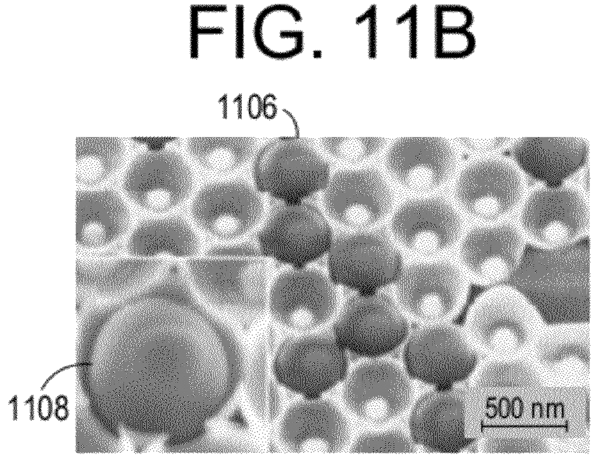
Figure 11E:
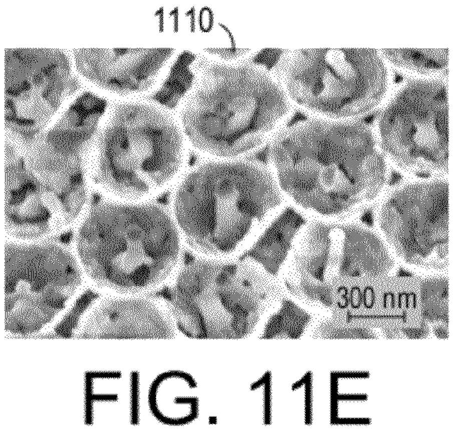

A micrograph 1100 of catalyst particles on a substrate is shown in FIG. 11A. A micrograph 1102 of patterned aligned nanorods is shown in FIG. 11B. A micrograph 1104 of an array of nanobowls is shown in FIG. 11C. A micrograph 1106 of an array of nanobowls used in size sorting nanoparticles, with an enlarged detail of a nanoparticles in a nanobowl 1108, is shown in FIG. 11D. A micrograph 1110 of an array of nanobowls with nanorods grown therefrom is shown in FIG. 11E.

Several results of experimental embodiments will now be discussed.

The invention combines the self-assembly based mask technique with the surface epitaxial approach to grow large-area hexagonal arrays of aligned ZnO nanorods. This approach opens the possibility of creating patterned 1D nanostructures for applications as sensor arrays, piezoelectric antenna arrays, optoelectronic devices, and interconnects.

The synthesis process involves three main steps. The hexagonally patterned ZnO nanorod arrays are grown onto a single crystal $Al_2O_3$ substrate, on which patterned Au catalyst particles are dispersed. First, a two-dimensional, large-area, self-assembled and ordered monolayer of sub-micron spheres was formed on a single crystal $Al_2O_3$ substrate. Second, a thin layer of gold particles was deposited onto the self-assembled monolayer; and then the spheres were etched away, leaving a patterned gold catalyst array. Finally, nanorods were grown on the substrate using a VLS process. Details on each step are described below.

Monolayer self-assembled arrays of sub-micron spheres: The first step was to prepare an ordered monolayer of spheres by self-assembly. For this mono-dispersed polystyrene (PS) spheres suspensions were purchased from Duke Scientific Corp. and used as received. The concentration of the suspensions was 10% spheres and the diameter of the spheres used in our experiments was 895 nm. For deposition, a 1 cm×1 cm single-crystal sapphire $(2\bar{1}\bar{1}0)$ substrate was sonicated for 20 minutes in a 2% Hellmanex II solution followed by a 3 hour anneal in air at 1000° C. to achieve a completely hydrophilic and atomically flat surface. Then, 2 or 3 drops of the PS sphere suspension was applied to the surface of the substrate. After holding the substrate stationary for 1 minute to obtain good dispersion of the suspension, the sapphire substrate was then slowly immersed into deionized water. Once the suspension contacted the water's surface, a monolayer of PS spheres was observed to immediately form, both on the surface of the water and on the surface of the sapphire substrate. To prevent any further additions to the substrate it was kept immersed. Then, a few drops of 2% dodecylsodiumsulfate solution were added to the water to change the surface tension. As a result, the monolayer of PS spheres that remained suspended on the surface of the water was pushed aside due to the change in the surface tension. The substrate was then removed through the clear area where the surface tension of the water had been modified by the surfactant; thus, no additional PS spheres were deposited on the monolayer during its removal from the water. A metal frame was used to support the sample above the water surface while the sample was sonicated to avoid clustering of the PS spheres during drying.

The substrate was 90% covered by the monolayer. The area of a single domain can reach a few square millimeters.

The self-assembled arrays of polystyrene spheres were then used to pattern the catalyst used to guide ZnO growth onto substrate. For this process, gold particles were either sputtered or thermally evaporated onto the self-assembled monolayer structure; as a result, two different patterns were obtained. For the sputtered coatings the high mobility of the gold atoms during the sputtering process, resulted in gold covering every available area, even beneath the spheres. Therefore, after etching away the polystyrene spheres using toluene, this technique produced a honeycomb-like hexagonal gold pattern. However, by using a thermal evaporator, which provides a line of sight vapor stream, the gold particles were only deposited onto areas of the substrate that were not shadowed by the polystyrene spheres. After etching away the polystyrene spheres, a highly ordered hexagonal array of gold spots was formed on the substrate.

Using the patterned catalyst, ZnO nanorods were grown by a solid-liquid-vapor process. The source materials contained equal amounts (by weight) of ZnO powder (0.8 gram) and graphite powder, which was used to lower the growth temperature. The source materials were then ground together and loaded into an alumina boat that was placed at the center of an alumina tube with the substrate being positioned slightly downstream from the tube's center. Both ends of the tube were water cooled to achieve a reasonable temperature gradient. A horizontal tube furnace was used to heat the tube to 950° C. at a rate of 50° C./min and the temperature was held for 20-30 minutes under a pressure of 300-400 mbar at a constant argon flow at 25 sccm. Then the furnace was shut down and cooled to room temperature under a flow of argon.

By changing the growth time the height of the ZnO nanorods could be varied from a few hundred nanometers to a few micrometers. Most of the ZnO nanorods grow perpendicular to the substrate (that is, vertically), but that a few can also grow parallel to the substrate, and have a growth root from the same catalyst particle that promotes vertical nanorod growth.

Photoluminescence (PL) spectra were acquired from the aligned ZnO nanorods to reveal their collective optical properties. The PL measurements were performed at room temperature using a 337 nm $N_2$ pulsed laser as the excitation light source. The laser pulse frequency was 15 Hz, with 800 ps pulse duration at an average energy of 50 mW. The laser was incident onto the sample at an angle of 45°, while the detection angle was defined as the angle between the detector and the direction normal to the substrate, as shown in the inset in FIG. 5. The emission spectra were recorded at four different detection angles, 0, 15, 30 and 45 degrees. The aligned ZnO nanorods exhibit a peak at 384 nm at $\theta=0$ degree. As the detection angle was increased, the luminescence intensity dropped dramatically, which may indicate that the luminescence was emitted mainly along the axis of the ZnO nanorods. Moreover, the luminescence peak shifted very slightly from 384 nm to 383 nm when the detection angle increased from 0 to 45 degrees. This may also be caused by the polarization of the emitted light from the aligned nanorods.

The synthesis technique uses a catalyst template produced from a self-assembled monolayer of sub-micron polystyrene spheres that guides the VLS growth of ZnO onto a single crystal alumina substrate. This approach opens the possibility of creating patterned 1D nanostructures for applications as sensor arrays, piezoelectric antenna arrays, optoelectronic devices, and interconnects.

Nanobowls: Capturing of virus or cells is critically important in biomedical application, environmental filtering, water purification, and cleaning air pollutions. Due to the small size of the particles, special size cups are needed for capturing the virus or cells. In this disclosure, we have invented a very economic technique for large-scale fabrication of nanobowls without using lithiography or clean room. The size of the nanobowls can be tuned between 50 nm to 10 μm, allowing them to fit to the size of a wide rang of applications. This is a useful technology for biomedical research and applications.

The experimental procedure includes four steps. 1. Self-assembly of a monolayer of polystyrene (PS) spheres. A large-area monolayer of PS spheres within a size range from a few hundred nanometers to a few microns can be self-assembled on any substrate with a smooth and hydrophilic surface. 2. Atomic layer deposition (ALD) of amorphous $TiO_2$ thin films. The substrate with a monolayer of PS spheres was placed at the center of a quartz ALD chamber, which was kept at 80° C. during the entire growth process. Then, pulses of $TiCl_4$ vapor and $H_2O$ vapor were introduced sequentially into the chamber under a vacuum of 4.5 torr. The pulse duration was 4 second, and the pulses were separated by $N_2$ purging gas for 10 second. A $TiO_2$ layer was slowly grown on the surfaces of the PS spheres and the substrate at a growth rate of 0.12 nm/cycle. The growth was terminated after 200 pulse cycles, which produced a uniform amorphous $TiO_2$ layer of 24 nm in thickness deposited on the surfaces. 3. Ion milling. An ion milling machine that was originally used for preparing TEM samples was used to remove the top half of the $TiO_2$ layer coated PS spheres. The ion beam, which was generated by a high-voltage of 5 kV, stroke on the sample surface at a grazing angle of 10° while the sample was continuously rotated. After 20-minute milling, the top half of the spheres was evenly removed in the case of using 505 nm PS spheres. 4. Toluene etching and annealing. The PS hemispheres that left on the substrate were etched away by sonicating the substrate in toluene for 1.5 minutes, resulting in highly-ordered arrays of $TiO_2$ nano-bowls. The amorphous $TiO_2$ nano-bowls can be converted into crystalline nano-bowls by annealing. After annealing at 850° C. for 2 hours in air, nano-bowls composed of nanocrystalline anatase $TiO_2$ were received.

As one of the important functional semiconductors, $TiO_2$ exhibits promising applications in solar cell, photocatalytic, and photovoltaic technology. As described above, robust and highly-ordered anatase $TiO_2$ nano-bowl arrays have been successfully fabricated, which have a larger open surface area that could significantly increase the efficiency of surface related activities. The technique demonstrated can also be applied to different substrates that have smooth and hydrophilic surfaces, such as silicon, glass, metals or even polymer. This will broaden its application in various fields. The nano-bowls could also be lifted off from the substrate to form monolayer submicron filters. Moreover, the thickness of the $TiO_2$ wall can be precisely tuned by varying the number of ALD cycles, and the size of bowls can be adjusted by using different sized PS spheres as templates. Therefore, the bowls could also be a good candidate as a size separator and container for fine particles, or even for bio species such as cells if the interior surface is coated with proper functional groups.

Field Emission 1D Nanostructures Experimental procedure: First, a conducting substrate, such as silicon wafer or GaN single crystal, is coated with a thin layer (~5 nm) of metal catalyst. The metal can be gold, nickel, cobalt, iron, copper, and so on, depending on the 1D nanostructure to be grown. Second, a submicron-sized polystyrene (PS) sphere monolayer is applied onto the substrate through self-assembly. Then, a high-quality $TiO_2$ layer is evenly coated around the PS spheres and on the substrate by atomic layer deposition (ALD) technique. An ion milling machine is then used to remove the top half of the $TiO_2$ coated PS spheres and the PS hemispheres left on the substrate are etched away by toluene, resulting in a highly-ordered array of $TiO_2$ nano-bowls with open bottoms. Finally, the exposed metal area at the center of the nano-bowls catalyzes the growth of corresponding 1D nanostructures through a Vapor-Liquid-Solid (VLS) process and ended with highly ordered and aligned 1D nanostructures that are separated by $TiO_2$ nano-bowls.

Field Effect Transistor Arrays Experimental procedure: First, a conducting substrate, such as silicon wafer or GaN single crystal, is coated with a thin layer (~5 nm) of metal catalyst. The metal can be gold, nickel, cobalt, iron, copper, and so on, depending on the 1D nanostructure to be grown. Second, a $SiO_2$ layer is grown onto the metal catalyst layer to form an insulator layer. Third, a submicron-sized polystyrene (PS) sphere monolayer is applied onto the substrate through self-assembly. Then, a high-quality $TiO_2$ layer is evenly coated around the PS spheres and on the substrate by atomic layer deposition (ALD) technique. An ion milling machine is then used to remove the top half of the $TiO_2$ coated PS spheres and the PS hemispheres left on the substrate are etched away by toluene, resulting in a highly-ordered array of $TiO_2$ nano-bowls with open bottoms. The $SiO_2$ at the open bottom area is etched away by HF solution so that the metal catalyst beneath the $SiO_2$ layer is exposed. Finally, the exposed metal catalyzes the growth of corresponding 1D nanostructures at the center of each nano-bowl through a Vapor-Liquid-Solid (VLS) process. To form a field emission transistor array, the conducting substrate that contacts with the 1D nanostructures is used as the emitter electrode and the $TiO_2$ bowls that is isolated from the substrate by a $SiO_2$ layer are used as the gate electrode.

Applications: By growing the aligned ZnO nanorods in the center of the nanobowls, the nanorods' density can be well controlled by varying the sizes of the nanobowls. Thus, the field emission property of the aligned ZnO nanorods can be optimized. By introducing an insulating layer such as $SiO_2$ between the substrate and catalyst, the nanobowls can be separated from both the substrate and the ZnO nanorods. This configuration can be used as a field effect transistor array. When a small voltage is applied between the substrate and the ZnO nanorods tips, each ZnO nanorod is acting as a field emission tip. Their field effect can be switched on/off by applying another small voltage on the nanobowls array, which is considered as a gate electrode in this configuration. Both of these hierarchical structures are entirely based on self-assembly technique, which provides a novel technique for quick and large scale fabricating field effect transistor arrays in low cost comparing to lithography. These self-assembled field effect transistor arrays can be used for electron guns and field emission displayers.

What is claimed is:

1. A method of making patterned nanostructures, comprising the steps of:

a. placing a self-assembled monolayer of organic spheres on a substrate, the organic spheres defining interstitial areas between the organic spheres, the placing step including:

i. adding a plurality of organic spheres to a liquid having a surface tension that would cause the organic spheres to self-assemble into a substantially ordered monolayer on a top surface of the liquid;

ii. placing the substrate in the liquid;

iii. drawing the substrate out of the liquid so that the substrate is at an angle that is transverse to the monolayer so that the organic spheres become disposed on the top surface of the substrate; and iv. allowing any remaining liquid to dry from the substrate and the organic spheres;

b. applying catalyst particles to the monolayer and allowing the catalyst particles to settle onto the substrate in the interstitial areas;

c. removing the organic spheres, thereby leaving a patterned arrangement of catalyst particles on the substrate; and d. growing nanorods from the substrate in the interstitial areas.

2. The method of claim 1, wherein the substrate comprises a single crystal of aluminum oxide.

3. The method of claim 1, wherein the catalyst particles comprise gold.

4. The method of claim 1, wherein the removing step comprises etching the organic spheres.

5. The method of claim 4, wherein the etching step comprises applying a solvent to the organic spheres.

6. The method of claim 5, wherein the organic spheres comprise polystyrene and wherein the solvent comprises an organic solvent.

7. The method of claim 1, wherein the growing step comprises a chemical vapor deposition process.

8. The method of claim 1, wherein the nanorods comprise zinc oxide.

* * * * *